United States Patent [19]

Ono et al.

[11] Patent Number: 4,758,789
[45] Date of Patent: Jul. 19, 1988

[54] ESR SPECTROMETER HAVING SPLIT-RING RESONATOR

[75] Inventors: Mitsuhiro Ono; Tateaki Ogata; Kokusho Sha; Michiya Suzuki, all of Yamagata; Ekuo Yoshida, Tokyo, all of Japan

[73] Assignee: Jeol Ltd., Tokyo, Japan

[21] Appl. No.: 38,646

[22] Filed: Apr. 15, 1987

[30] Foreign Application Priority Data

Nov. 7, 1986 [JP] Japan ............... 61-264922

[51] Int. Cl.⁴ ............................. G01R 33/20
[52] U.S. Cl. ................... 324/316; 324/318; 333/219
[58] Field of Search ......... 324/315, 316, 317, 318, 324/58 C, 58.5 C; 333/219, 235

[56] References Cited

U.S. PATENT DOCUMENTS 4,446,429  5/1984  Froncisz et al. ............... 324/316

OTHER PUBLICATIONS

W. N. Hardy and L. A. Whitehead, "Split-Ring Resonator for Use in Magnetic Resonance from 200-2000 MHz", Rev. Sci. Instrum. 52(2), Feb. 1981, pp. 213-216.

Primary Examiner—Stewart J. Levy
Assistant Examiner—Kevin D. O'Shea
Attorney, Agent, or Firm—Webb, Burden, Ziesenheim & Webb

[57] ABSTRACT

An ESR spectrometer is equipped with a split-ring resonator comprising an electrically conductive cylinder or loop which may be excited by a microwave antenna. The conductive cylinder or loop is secured to a surface of an insulating sheet whereby the other surface may be brought to bear upon the specimen being examined. Preferredly, the insulating sheet comprises two insulating sheets with a Faraday shield sandwiched therebetween whereby the magnetic field generated by the microwave energy applied to the loop leaks to the surface of the specimen but the electric field is inhibited.

3 Claims, 2 Drawing Sheets

ESR SPECTROMETER HAVING SPLIT-RING RESONATOR

FIELD OF THE INVENTION

The present invention relates to an electron spin resonance (ESR) spectrometer equipped with a split-ring resonator.

BACKGROUND OF THE INVENTION

In recent years, split-ring resonators have attracted attention as the resonators of ESR spectrometers. A split-ring resonator is shown in the perspective view of FIG. 1, where a circular cylinder 1 is made from an electrically conductive material. The cylinder 1 is formed with a slit 2, which has a certain width and extends along the central axis 0 of the cylinder 1. A sample (not shown) is inserted into the cylinder 1 along the axis 0. The whole cylinder is shielded by a metallic tube 3. The resonator is connected with an external circuit (not shown) via a loop antenna 4 and a coaxial line 5. This split-ring resonator is higher in sensitivity and permits a larger sample to be inserted into it and examined than the cavity resonator conventionally employed. This split-ring resonator is described in U.S. Pat. No. 4,446,429 and Rev. Sci. Instrum. 52(2), February 1981, pp. 213-216.

The split-ring resonator has some advantages as described above. However, where the specimen to be investigated is so large that it cannot be accommodated in the cylinder, the cylinder must be split to receive the sample. If the specimen is the human body, for example, then such a division of the cylinder is not feasible. In this case, the diameter of the cylinder is large enough to receive a human arm or head, which makes the instrument large and leads to a decrease in the quality factor (Q). Consequently, practical performances such as sensitivity and resolution may not be satisfactorily high.

SUMMARY OF THE INVENTION

It is an object of this invention to provide an ESR spectrometer which is not very large but capable of investigating large specimens by ESR spectroscopy with high sensitivity and high resolution.

The above object is achieved in accordance with the teachings of the invention by an electron spin resonance spectrometer equipped with a split-ring resonator comprising a cylinder which is made from an electrically conductive material and provided with a slit extending along the central axis of the cylinder. The cylinder is mounted on a sheet of an insulator the rear surface of which may be brought to bear upon a sample to be examined.

In one embodiment of the invention, the height of the cylinder is small and so it may be called a loop having a slit. This loop is mounted on the sheet of the insulator. The rear surface of the sheet may be brought to bear upon the specimen. A paramagnetic substance which is located near the surface of the specimen and to which microwave magnetic field leaking from the loop acts can be investigated by ESR spectroscopy.

BRIEF DESCRIPTION OF THE DRAWINGS

FIGS. 2(b) and 3(b) are views along lines 2(b)-2(b) and 3(b)-3(b) in FIGS. 2(a) and 3(a), respectively;

DESCRIPTION OF THE PREFERRED EMBODIMENTS

Figure 1:
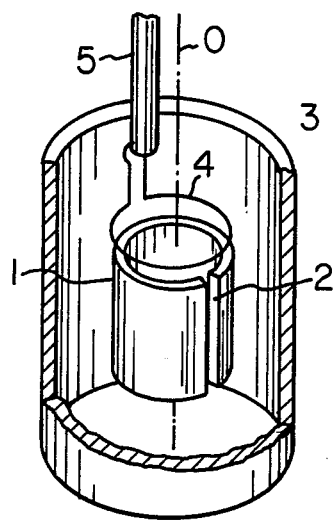
FIG. 1 is a perspective view of the conventional split-ring resonator.
Figure 2A:
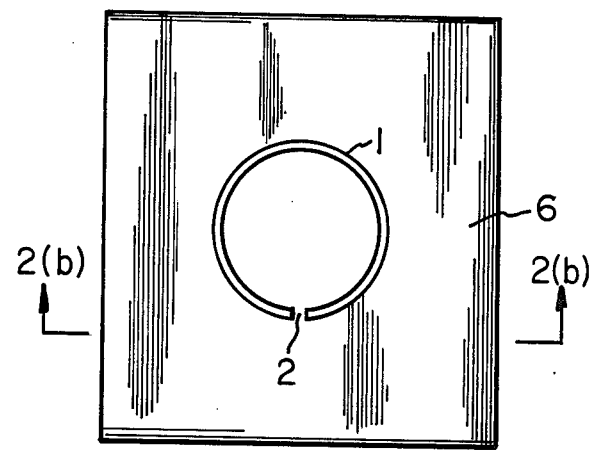
FIGS. 2(a), 2(b), 3(a) and 3(b) are schematic representations of the main portions of ESR spectrometers according to the invention.
Figure 2B:
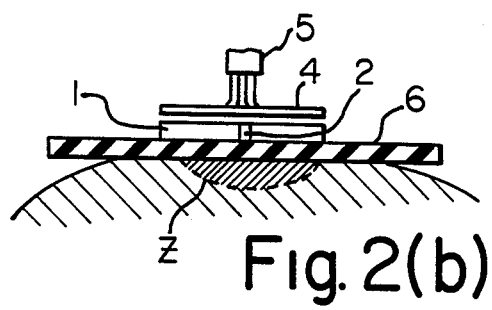

Referring to FIGS. 2(a) and 2(b), there is shown a split-ring resonator according to applicants' invention. It is to be noted that like components are denoted by like reference numerals throughout all the figures. The resonator has a cylinder 1 whose height is much smaller than that of the cylinder 1 shown in FIG. 1. The cylinder 1, or loop, is secured to a sheet 6 of an insulator. The cylinder may be so disposed that it is in contact with, or slightly spaced from, the rear surface of the sheet 6. The front surface of the sheet 6 faces a specimen 7 to be investigated, such as the human body. The whole resonator shown in FIGS. 2(a) and 2(b) FIG. 2 is placed in a static magnetic field of an appropriate magnitude.

In the operation of the structure described above, microwaves of a given frequency are supplied to the loop 1 via a loop antenna 4, so that a magnetic field is produced within the loop 1. This magnetic field leaks from the loop and acts on a region Z on the surface of the specimen. Thus, the region Z can be examined by ESR spectroscopy.

In applicants' instrument, the sample is not inserted in the split-ring resonator, but the microwave magnetic field leaking from the loop is utilized. The sheet carrying the loop is caused to bear on the specimen to investigate it by ESR spectroscopy. Therefore, any desired portion of the large specimen can be investigated by ESR spectroscopy by moving the position of the specimen at which the sheet carrying the loop bears. Also, the loop can be made small. Hence, the instrument can be miniaturized. Further, it is easy to increase the quality factor (Q).

Both the electric field as well as the magnetic field set up by the microwaves leaks from the loop 1. Where the dielectric loss of the specimen is small, no problems will occur. However, when the specimen contains a substance of a large dielectric loss, the energy of the electric field is consumed by this substance. Therefore, it is inevitable that the quality factor (Q) of the resonator decreases. Especially when the specimen is a living body such as the human body, the dielectric loss is large, presenting serious problems.

Figure 3A:
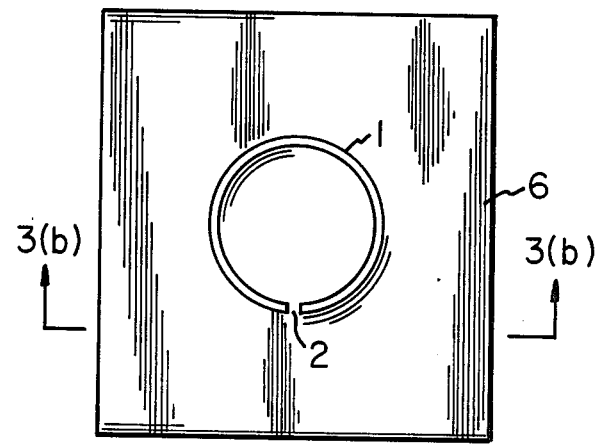
Figure 3B:
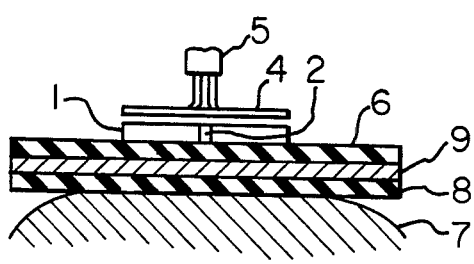
Figure 4:
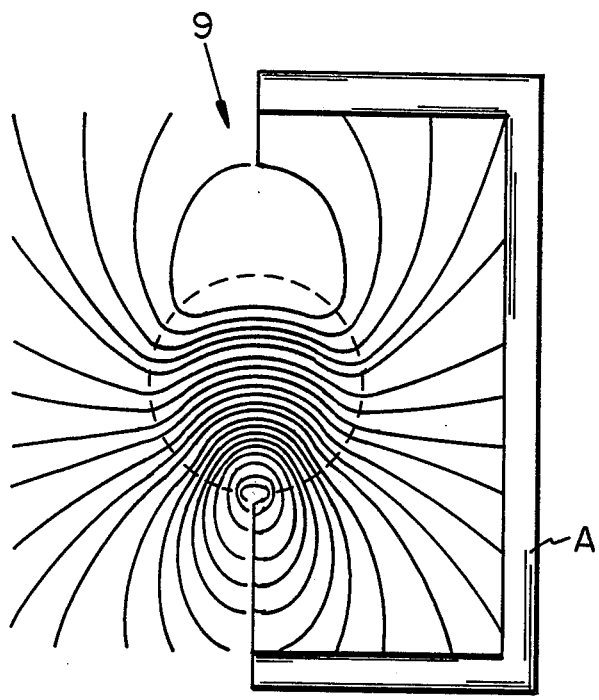
FIG. 4 is a diagram for illustrating the effect of a Faraday shield.

FIGS. 3(a) and 3(b) schematically shows an instrument which can prevent the quality factor (Q) from decreasing even if a sample having a large dielectric loss is examined. A Faraday shield 9 made of a conductive material is formed on a sheet 8 (or 6) of an insulator. Usually, a Faraday shield is composed of a series of parallel straight wires which are regularly spaced from each other. Hence, such a conventional Faraday shield has a screen-like conductive pattern. The Faraday shield 9 consists of a conductive pattern as shown in FIG. 4 and formed on the insulator sheet 8 (or 6) by photoetching or similar techniques. The frame electrode A is grounded. The loop is disposed on the broken line shown in FIG. 4. The conductive pattern shown in FIG. 4 corresponds to the distribution of the electric lines of force produced inside and outside of the loop 1. Therefore, the specimen 7 is well shielded by the conductive pattern against the electric field produced by the loop 1. On the other hand, the magnetic field reaches the sample almost without being affected by the conductive pattern. Therefore, even if the dielectric loss factor of the sample is large, the practical loss can be made small. Consequently, decrease in the quality factor (Q) can be prevented.

For a frequency of about 1 GHz the narrow thin belts shown in FIG. 4 would be dimensioned more or less as follows: The frame electrode A is approximately 75 mm long on the left edge. The width of the frame electrode is rather immaterial. The depth of the frame electrode and all of the narrow thin belts that are arranged in the pattern shown have a depth of about 0.035 mm. The width of the narrow thin belts that are arranged in the pattern is 0.13 mm. These narrow thin belts are connected to the frame or ground electrode but they do not form a loop as it is necessary to prevent the flow of electric current in each Faraday shield belt. For this reason the ground electrode is not a complete square.

In the examples shown in FIGS. 2(a), 2(b), 3(a) and 3(b), when the specimen is thin and small, it can be placed within the loop and investigated in a conventional manner.

Figure 5A:
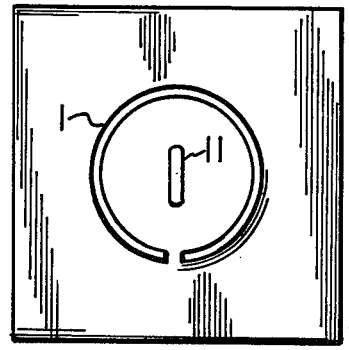
FIGS. 5(a), 5(b), 6(a) and 6(b) are schematic views of instruments for obtaining data shown in FIG. 7.
Figure 5B:
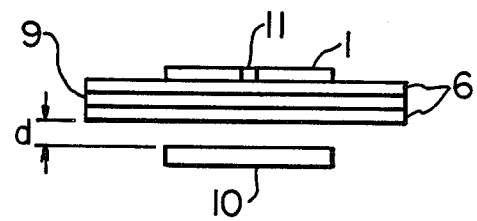
Figure 6A:
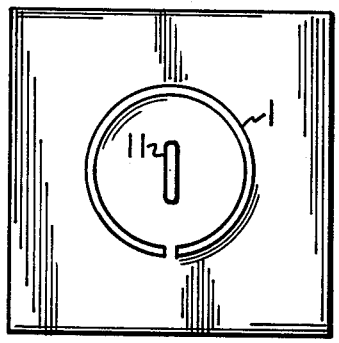
Figure 6B:
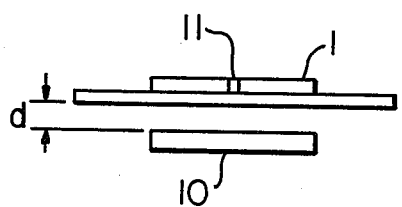
Figure 7:
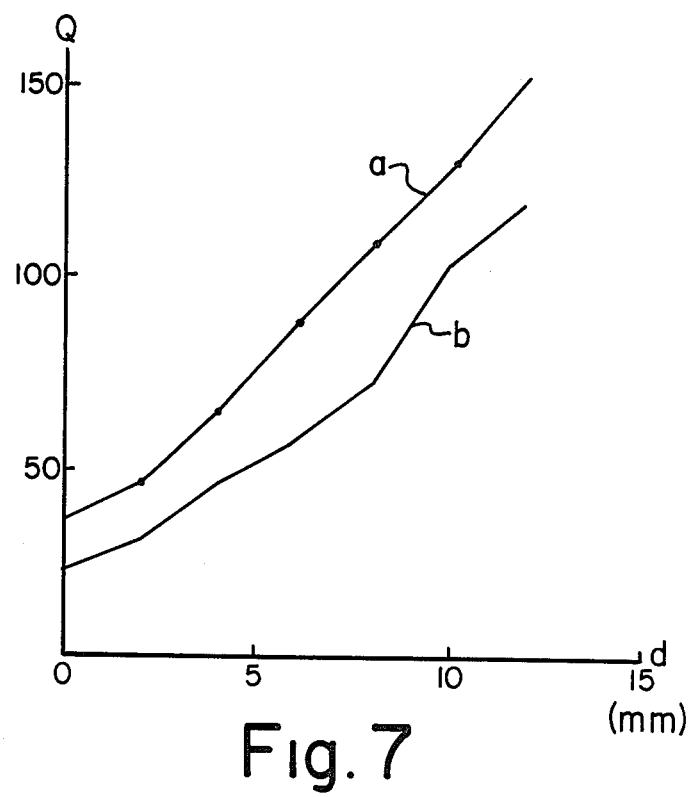
FIG. 7 is a graph in which the quality factor (Q) is plotted against the conditions of measurements made by the instruments.

FIGS. 5(a), 5(b), 6(a), and 6(b) schematically illustrate experiments performed to obtain data shown in FIG. 7. In FIGS. 5(a) and 5(b), the instrument shown in FIG. 3 is used, and the sample 11 that is very small is placed inside the loop 1. A certain amount of physiological salt solution 10 of a large dielectric loss is spaced a distance d fro the loop 1. In FIGS. 6(a) and 6(b), the instrument shown in FIG. 2 which is identical in size with the instrument shown in FIG. 3 is employed. The sample 11 is also placed inside the loop 1. A certain amount of physiological salt solution 10 is spaced a distance d from the loop 1.

In the graph of FIG. 7, the quality factor (Q) is plotted against the distance d shown in FIGS. 5(b) and 6(b). Curve a was obtained using the arrangement shown in FIG. 5(b), while curve b was derived using the arrangement shown in FIG. 6(b). It can be seen from this graph that the instrument of FIG. 3 equipped with the Faraday shield (curve a) having the conductive pattern corresponding to the electric lines of force yielded higher quality factors than the instrument of FIG. 2 over the whole range of the distance.

The distribution of the electric lines of force shown in FIG. 4 can be determined by using a computer in the manner described below: (1) The distribution of the electric charges on the loop is measured; (2) The electric field intensity that each individual point lying inside or outside of the loop is measured, the electric field being produced by the electric charges on the loop; and (3) the electric lines of force are determined from the obtained electric field distribution.

As described in detail above, the present invention makes use of a split-ring resonator which is made to bear on the surface of a specimen to examine it by ESR spectroscopy. Consequently, an ESR spectrometer can be realized which can investigate a certain region of a large specimen that lies near the surface, though the spectrometer is not large in size.

In the instrument shown in FIGS. 3(a) and 3(b), the Faraday shield having a conductive pattern corresponding to the electric lines of force produced from the loop is disposed between the split-ring resonator and the specimen. This makes it possible to examine the specimen with high quality factor (Q), even if the dielectric loss of the sample is large.

Having thus described the invention with the detail and particularly required by the Patent Laws, what is desired protected by Letters Patent is set forth in the following claims.

What is claimed is:

1. An ESR spectrometer equipped with a split-ring resonator comprising a cylinder which is made of an electrically conductive material and provided with a slit extending along the central axis of the cylinder,
    said cylinder being mounted on one surface of a sheet of an insulator, such that the other surface of the shet may be brought to bear upon the specimen to be investigated.

2. An ESR spectrometer equipped with a split-ring resonator comprising a cylinder which is made of an electrically conductive material and provided with a slit extending along the central axis of the cylinder,
    a Faraday shield having a conductive pattern corresponding to the distribution of the electric lines of force produced from the cylinder, said shield being interposed between two sheets of an insulator, said cylinder being mounted on one of the two sheets, such that the sheet may be brought to bear upon the specimen being investigated.

3. The spectrometer according to claim 2 wherein the Faraday shield comprises a grounded frame electrode and a pattern of conductors in communication at each end with the frame electrode arranged in a conductive pattern corresponding to the distribution of the electric lines of force produced inside and out of the cylinder.

* * * * *

UNITED STATES PATENT AND TRADEMARK OFFICE
CERTIFICATE OF CORRECTION

PATENT NO. : 4,758,789
DATED : July 19, 1988
INVENTOR(S) : Mitsuhiro Ono, Tateaki Ogata, Kokusho Sha, Michiya Suzuki and Fkuo Yoshida It is certified that error appears in the above-identified patent and that said Letters Patent is hereby corrected as shown below:

Column 2 Line 6 after "7;" insert --and--.

Column 2 Line 24 after "2(b)" delete --FIG. 2--.

Column 2 Line 54 "shows" should read --show--.

Column 3 Line 34 "fro" should read --from--.

Column 4 Line 3 after "loop" insert --sees--.

Claim 1 Column 4 Line 32 "shet" should read --sheet--.

Signed and Sealed this

Twenty-eighth Day of February, 1989

Attest:

DONALD J. QUIGG

Attesting Officer

Commissioner of Patents and Trademarks